Figure 1:
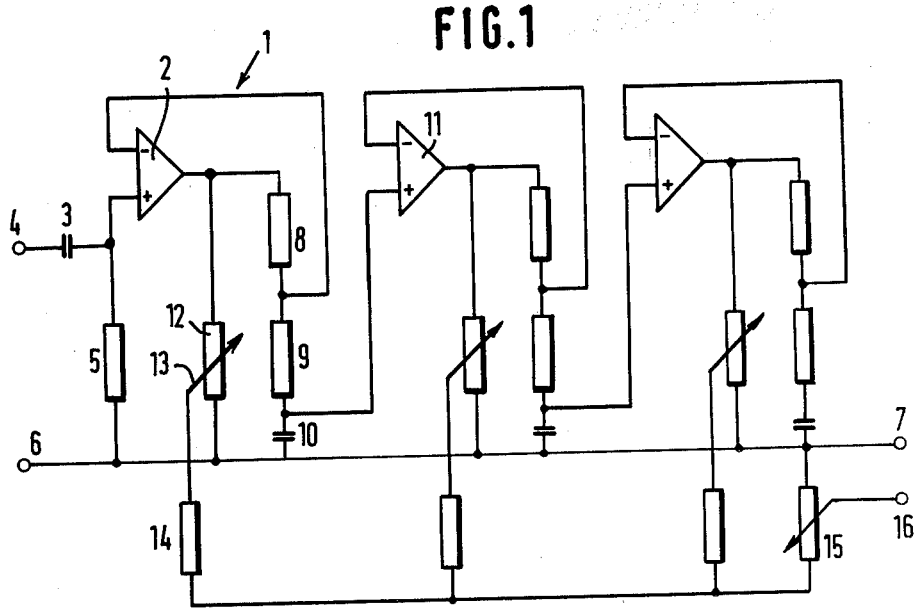

United States Patent [19]

Laupman

[11] 4,095,188

[45] June 13, 1978

[54] CASCADED AMPLIFIER WITH FREQUENCY SENSITIVE COUPLING

[75] Inventor: Robert Ronald Laupman, Wijchen, Netherlands

[73] Assignee: Novanex Automation N.V., Wijchen, Netherlands

[21] Appl. No.: 829,468

[22] Filed: Aug. 31, 1977

[30] Foreign Application Priority Data

Sep. 1, 1976 Netherlands .......................... 7609730

[51] Int. Cl.² .......................... H03F 1/36; H03F 3/68
[52] U.S. Cl. ...................................... 330/84; 330/126; 330/151
[58] Field of Search ................. 330/84, 126, 151, 295, 330/302, 304, 306; 179/1 D; 333/28 T; 328/167

[56] References Cited

U.S. PATENT DOCUMENTS 3,818,362  6/1974  van Sluys .......................... 328/167 X Primary Examiner—James B. Mullins

[57] ABSTRACT

An amplifier having a plurality of cascaded stages each comprising an operational amplifier having an output connected to a first output terminal of the amplifier through two series-connected resistors and a capacitor, the junction point of the two resistors being connected to the negative input of the operational amplifier, and the junction point of the capacitor and one of the series-connected resistors being connected to the positive input of a next operational amplifier, the output of each operational amplifier being additionally connected to said first output terminal through a variable resistor having a movable contact connected to the second output terminal of the amplifier.

1 Claim, 2 Drawing Figures

CASCADED AMPLIFIER WITH FREQUENCY SENSITIVE COUPLING

This invention relates to an amplifier of the kind having a plurality of cascaded stages.

In Dutch patent application No. 72,08762, there is described a transistor amplifier having a plurality of cascaded transistors, in which the base of the first transistor is connected to the input terminal of the amplifier, one of the remaining electrodes of each transistor is connected to the base of the next succeeding transistor and the other remaining electrode of each transistor is connected through a coupling capacitor to the output of the amplifier, and wherein the capacitance of the coupling capacitors progressively increases from the first to the final stage of the amplifier.

It has been found that with such a configuration when an input signal is supplied to the input terminal an additional weak signal is generated at said one electrode of the transistor, which additional signal comprises a higher proportion of low frequencies than does the original signal at the input terminal. This weak signal is then amplified by the subsequent transistor. Consequently, a signal comprising all frequencies of the input signal and a signal comprised by the amplified low frequencies of the input signal appear at the said other electrodes of the transistors as signals of essentially equivalent level. If therefore, the capacitance of the first coupling capacitor is selected low, only the high frequencies are supplied along this path, whereas only the frequencies are supplied via the next capacitor of higher capacitance. The resulting signals across voltage dividers connected to the capacitors can thus be separately processed further, controlled in intensity, re-combined to form a channel with separate high and low frequency control, etc. There is thus provided an amplifier with tone control that can be realized by simple means, and the performance of which is at least as good as that of corresponding known amplifiers.

It is an object of the present invention to modify the above prior circuitry in such a way that a so-called "rigid" output is obtained. As a result, a low impedance is presented to the mixing stage following the amplifier, which simplifies the matching of the two devices to one another. In addition the circuit is capable of processing signals of high intensity.

This is realized, according to the present invention, in that, in an amplifier as described in the above Dutch patent application, each amplifying element is designed as an operational amplifier, the output of which is connected through two series-connected resistors and the respective capacitor to a first output terminal of the amplifier, the junction point of said two resistors being connected to the negative input of the operational amplifier, and the junction point of the capacitor and one of the resistors being connected to the positive input of a next operational amplifier, the output of ech operational amplifier being additionally connected to the first output terminal through a variable resistor, the movable contact of which varible resistor is connected to the second output terminal of the amplifier.

Figure 2:
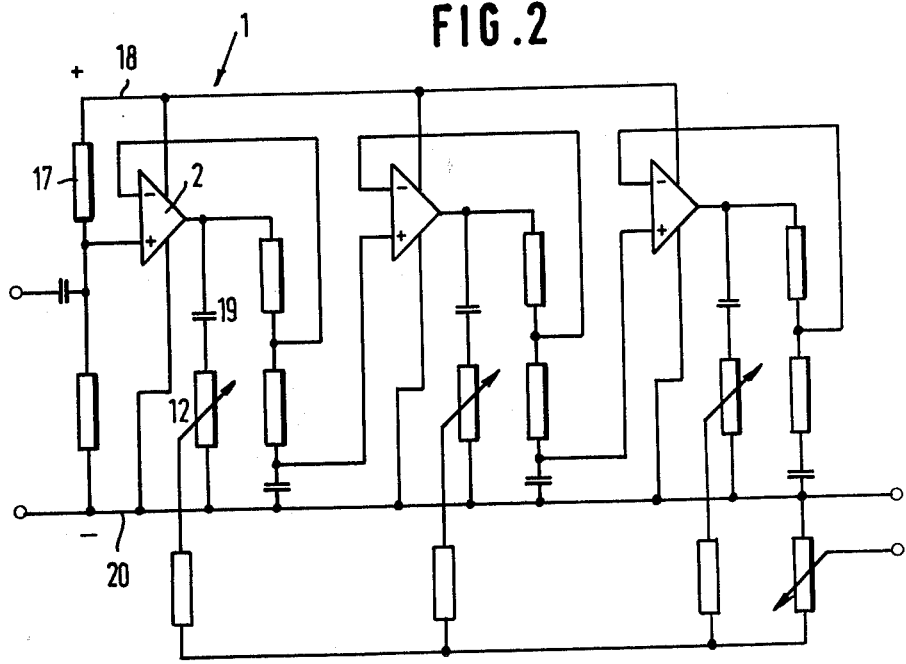

Two embodiments of the invention will now be described, by way of example, with reference to the accompanying drawings, In said drawings, FIG. 1 shows a circuit arrangement in accordance with this invention, comprising three stages and being designed for double supply; and FIG. 2 shows an embodiment of an amplifier according to the present invention similar to that of FIG. 1, but being designed for single supply.

Referring to FIG. 1, there is shown an amplifier which by way of example comprises three cascaded stages, the first of which is designated by reference numeral 1. The stages being similar in arrangement, only the first of these, stage 1, will be described in more detail.

As shown in FIG. 1, the first stage 1 comprises an operational amplifier 2, the positive terminal of which is connected through a coupling capacitor 3 to one input terminal 4 of the amplifier. This positive terminal is also connected through a resistor 5 to the other input terminal 6 of the amplifier, which in turn is connected to the first output terminal 7 of the amplifier.

The output of the operational amplifier is also connected to the first output terminal 7 of the amplifier through two series-connected resistors 8 and 9 and a capacitor 10 connected in series with these.

The junction point of the two resistors 8, 9 is connected to the negative input of operational amplifier 2. The junction point of resistor 9 and capacitor 10 is connected to the positive input of operational amplifier 11 forming part of the second stage, which in turn is wired identically to that of the first stage 1.

The output of operational amplifier 2 is additionally connected to the first output 7 of the amplifier through a variable resistor 12. The movable contact 13 of resistor 12 is connected through a resistor 14 and a second variable resistor 15 to the second output terminal 16 of the amplifier.

The capacitance of the capacitors 10 associated with the stages progressively increases in value from the first stage 1 to the final stage of the amplifier. As a consequence, the first stage 1 will process the high frequencies, the second stage the intermediate frequencies, and the final stage the low frequencies, as described in more detail in the above Dutch patent application 72,08762. For that matter, the operation of the entire amplifier corresponds in essence to that described in said Dutch patent application.

At stated hereinbefore, by virtue of the arrangement of the amplifier according to this invention, as described above, a more "rigid" output is obtained, whereby a low impedance is presented to the mixing stage (not shown) to be connected to the amplifier. The amplifier is additionally capable of processing signals of considerably higher value than can an amplifier as described in the above Dutch patent application.

While FIG. 1 shows an amplifier designed for double supply, FIG. 2 shows a similar amplifier designed for single supply only.

In this arrangement, the positive terminal of the operational amplifier 2 of the first stage 1 is connected through a resistor 17 to the plus line 18, and an additional capacitor 19 is connected between the output of the operational amplifier 2 and variable resistor 12. All operational amplifiers 2, 11, etc. are furthermore connected between the minus line 20 and the plus line 18, as shown in the drawing.

For the rest the arrangement of this amplifier corresponds entirely with that shown in FIG. 1, while the same advantages are obtained with it. Its arrangement and operation will therefore not be further described.

It is clear that the amplifier comprises at least two stages and is not limited to the three stages shown in the drawings.

I claim:

1. An amplifier having a plurality of cascaded stages each comprising an amplifying element, the output of each amplifying element being connected through a capacitor to a first output terminal of the amplifier, said capacitors being of increasing capacitance from the input stage of the final stage, characterized in that each amplifying element comprises an operational amplifier, the output of which is connected to said first output terminal through two series-connected resistors and the respective capacitor, the junction point of said two resistors being connected to the negative input of the operational amplifier, and the junction point of the capacitor and one of the series-connected resistors being connected to the positive input of a next operational amplifier, the output of each operational amplifier being additionally connected to the first output terminal through a variable resistor, the movable contact of which variable resistor is connected to the second output terminal of the amplifier.

* * * * *